(12) United States Patent
Strutz et al.

(10) Patent No.: US 11,662,232 B2
(45) Date of Patent: *May 30, 2023

(54) SENSOR PACKAGE AND METHOD FOR PRODUCING A SENSOR PACKAGE

(71) Applicant: Infineon Technologies AG, Neubiberg (DE)

(72) Inventors: Volker Strutz, Tegernheim (DE); Rainer Markus Schaller, Donau (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/736,204

(22) Filed: May 4, 2022

(65) Prior Publication Data

US 2022/0260397 A1 Aug. 18, 2022

Related U.S. Application Data

(63) Continuation of application No. 16/532,680, filed on Aug. 6, 2019, now Pat. No. 11,326,910.

(30) Foreign Application Priority Data

Aug. 14, 2018 (DE) .......................... 102018119677.6

(51) Int. Cl.
  *G01R 33/06* (2006.01)
  *G01R 33/07* (2006.01)
  *G01D 11/24* (2006.01)

(52) U.S. Cl.
  CPC ........... *G01D 11/245* (2013.01); *G01R 33/07* (2013.01)

(58) Field of Classification Search
  CPC .............................. G01D 11/245; G01R 33/07
  See application file for complete search history.

(56) References Cited

U.S. PATENT DOCUMENTS

| 11,326,910 | B2 | 5/2022 | Strutz et al. |
| 2011/0248711 | A1 | 10/2011 | Ausserlechner |
| 2012/0086090 | A1 | 4/2012 | Sharma et al. |
| 2014/0253103 | A1* | 9/2014 | Racz ................... G01R 15/202 324/149 |
| 2018/0149713 | A1 | 5/2018 | Latham et al. |

FOREIGN PATENT DOCUMENTS

DE 102011006972 A1 10/2011

* cited by examiner

*Primary Examiner* — Minh Q Phan
(74) *Attorney, Agent, or Firm* — Banner & Witcoff Ltd.

(57) ABSTRACT

A sensor package including a metal carrier and a sensor chip arranged on the metal carrier and having a first sensor element. In an orthogonal projection of the sensor chip onto a surface of the metal carrier, at least two edge sections of the sensor chip are free of overlap with the surface of the metal carrier. The sensor chip is designed to detect a magnetic field induced by an electric current flowing through a current conductor.

20 Claims, 9 Drawing Sheets

SENSOR PACKAGE AND METHOD FOR PRODUCING A SENSOR PACKAGE

CROSS REFERENCE TO RELATED APPLICATIONS

This application is a continuing application of U.S. patent application Ser. No. 16/532,680, filed on Aug. 6, 2019 and issued as U.S. Pat. No. 11,326,910 on May 10, 2022, which claims priority to Germany patent application number 102018119677.6, filed on Aug. 14, 2018, the contents of each of which are incorporated herein by reference in their entireties.

TECHNICAL FIELD

The present disclosure relates to sensor packages and methods for producing sensor packages.

BACKGROUND

In sensor packages, sensor chips can be mounted on metal carriers. The sensor chips can be designed to measure magnetic fields induced by an electric current flowing through a current conductor. Particularly at relatively high frequencies of AC electric currents, eddy currents can be generated in the metal carriers. The eddy currents generated can cause errors in the magnetic field strengths measured by the sensor chips. Manufacturers of sensor packages endeavor to provide improved sensor packages and methods for producing improved sensor packages. In particular, it may be desirable to provide sensor packages that provide accurate measurement results despite eddy currents being present. Furthermore, it may be desirable to specify methods for producing such sensor packages.

BRIEF SUMMARY

One aspect of the disclosure relates to a sensor package comprising a metal carrier, and a sensor chip arranged on the metal carrier and having a first sensor element, wherein in an orthogonal projection of the sensor chip onto a surface of the metal carrier, at least two edge sections of the sensor chip are free of overlap with the surface of the metal carrier, wherein the sensor chip is designed to detect a magnetic field induced by an electric current flowing through a current conductor.

A further aspect of the disclosure relates to a method for producing a sensor package, the method comprising providing a metal carrier, and arranging a sensor chip having a sensor element on the metal carrier, wherein in an orthogonal projection of the sensor chip onto a surface of the metal carrier, at least two edge sections of the sensor chip are free of overlap with the surface of the metal carrier.

BRIEF DESCRIPTION OF THE DRAWINGS

Sensor packages and methods for producing sensor packages in accordance with the disclosure are explained in greater detail below with reference to drawings. The elements shown in the drawings are not necessarily rendered in a manner true to scale relative to one another. Identical reference signs may designate identical components.

DETAILED DESCRIPTION

Figure 1A:
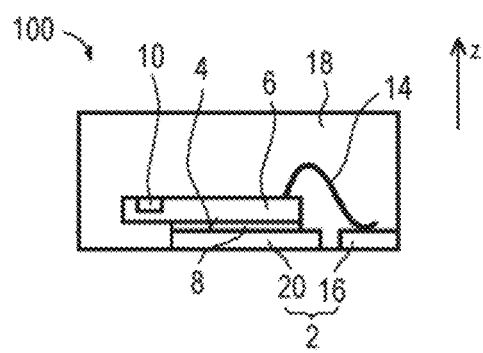
FIG. 1 contains FIGS. 1A and 1B, which schematically show a cross-sectional side view and a plan view of a sensor package 100 in accordance with the disclosure.
Figure 1B:
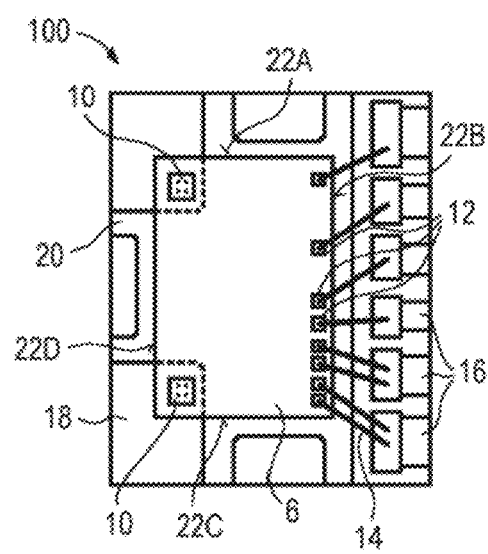

FIG. 1 contains FIGS. 1A and 1B and shows one example of a sensor package 100 in accordance with the disclosure. FIG. 1A shows a cross-sectional side view of the sensor package 100. FIG. 1B shows a plan view of the sensor package 100. The following observations regarding the sensor package 100 may also be applied to other sensor packages in accordance with the disclosure.

The sensor package 100 contains a metal carrier 2 and a sensor chip 6 arranged on a surface 4 of the metal carrier 2. The sensor chip 6 can be secured on the metal carrier 2 by way of a layer 8. The sensor chip 6 comprises sensor elements 10, which can be arranged on a side of the sensor chip 6 facing away from the metal carrier 2. The sensor chip 6 can comprise electrical connections 12 on its top side, which electrical connections can be electrically connected to connection conductors 16 of the metal carrier 2 via bond wires 14. The sensor package 100 can comprise an encapsulation material 18, which can at least partly encapsulate the components of the sensor package 100.

In the example in FIG. 1, the sensor package 100 can be a "leadless" package. In further examples, sensor packages in accordance with the disclosure can also be "flat lead" packages or "gullwing" packages, for example. The metal carrier 2 can be produced from copper, nickel, aluminum or high-grade steel, for example. In the example in FIG. 1, the metal carrier 2 can comprise a die pad 20 and a plurality of connection conductors 16. The sensor chip 6 can be secured on the die pad 20 by means of the layer 8. The layer 8 can be a solder layer or an adhesive layer, for example. The electrical connections 12 of the sensor chip 6 can be electrically connected to the connection conductors 16 via the bond wires 14. The sensor chip 6 can thus be electrically contacted from outside the encapsulation material 18 via the connection conductors 16. The encapsulation material 18 can be fabricated for example from a laminate, an epoxy resin, a thermoplastic or a thermosetting polymer.

The sensor chip 6 or the sensor element 10 can be designed to detect a magnetic field induced by an electric current flowing through a current conductor (not illustrated). In this case, the sensor element 10 can in particular face the current conductor. The current conductor can be arranged in particular outside the sensor package 100. The electric current flowing through the current conductor does not flow through the metal carrier 2. The sensor package 100 can be in particular a coreless sensor package, that is to say that the sensor package 100 does not use or contain a flux concentrator to concentrate the magnetic field generated by the electric current. In one example, a magnetic core can be used as a concentrator of the magnetic flux. In a further example, a soft-magnetic metal sheet can be used as a concentrator of the magnetic flux.

The sensor chip 6 can comprise one or more sensor elements 10, wherein each of the sensor elements 10 can be designed to detect the value of a magnetic field. In the example in FIG. 1, the sensor chip 6 comprises two sensor elements 10 and can be a differential sensor chip 6. In further examples, the number of sensor elements 10 can deviate from the example in FIG. 1. For example, a sensor chip can also comprise a single sensor element or three sensor elements.

The sensor chip 6 can be, in particular, an integrated circuit, such that reference can also be made to a sensor IC. In one example, the sensor chip 6 can be a Hall sensor or a Hall IC. In further examples, the sensor chip 6 can be an xMR sensor, in particular an AMR sensor, a GMR sensor or a TMR sensor. In the case of a Hall sensor, the sensor elements 10 can be Hall elements or Hall sensor elements, which can be integrated into the circuit. Signal amplification, analog-to-digital conversion, digital signal processing and offset and temperature compensation can furthermore be carried out in the Hall IC. Besides the Hall plates, the components for signal amplification and/or analog-to-digital conversion may or may not be regarded as part of the sensor element 10. In one example, the Hall sensor can be a lateral Hall sensor, which detects magnetic fields perpendicular to the chip surface. In a further example, the Hall sensor can be a vertical Hall sensor, which detects magnetic fields parallel to the chip surface.

In the example in FIG. 1, the sensor chip 6 has a rectangular shape in plan view and has four edges 22A, 22B, 22C, 22D. It is evident from FIG. 1B that in an orthogonal projection of the sensor chip 6 onto the surface 4 of the metal carrier 2, exactly three edges 22A, 22C and 22D of the sensor chip 6 are free of overlap with the surface 4 of the metal carrier 2. More precisely, in the orthogonal projection, four edge sections of the sensor chip 6 are free of overlap with the surface 4 of the metal carrier 2, namely one edge section of the edge 22A, one edge section of the edge 22C and two edge sections of the edge 22D. The orthogonal projection is effected in FIG. 1 along a z-axis shown in FIG. 1A, which z-axis can extend in particular perpendicular to the surface of the sensor chip 6 and respectively to the surface 4 of the metal carrier 2. In the orthogonal projection of the sensor chip 6 onto the surface 4 of the metal carrier 2, two corners of the sensor chip 6 are free of overlap with the surface 4 of the metal carrier 2. In the example in FIG. 1, the sensor elements 10 are arranged in the two overlap-free corners. It is evident from FIG. 1A that the sensor chip 6 hangs over the edge of the metal carrier 2 at the overlap-free corners.

As already mentioned, sensor chips can be designed to measure magnetic fields induced by an electric current flowing through a current conductor. Particularly in the case of AC currents having relatively high frequencies, eddy currents can be generated in metal carriers of the sensor devices. Such eddy currents are often also referred to in German as Eddy-Currents. The intensity of the magnetic field strengths detected by the sensor elements of the sensor chip can be altered, in particular reduced, by the eddy currents generated. In other words, the sensor elements cannot accurately detect the strength of the magnetic field on account of the eddy currents generated. In the plan view in FIG. 1B, the sensor elements 10 and the metal carrier 2 are arranged in a manner free of overlap. The influence of the eddy currents on the measurement results can be reduced as a result of this arrangement of the sensor elements 10 relative to the metal carrier 2.

Figure 2A:
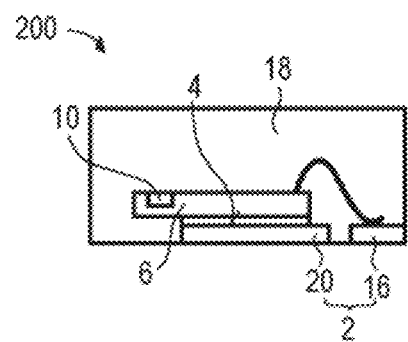
FIG. 2 contains FIGS. 2A and 2B, which schematically show a cross-sectional side view and a plan view of a sensor package 200 in accordance with the disclosure.
Figure 2B:
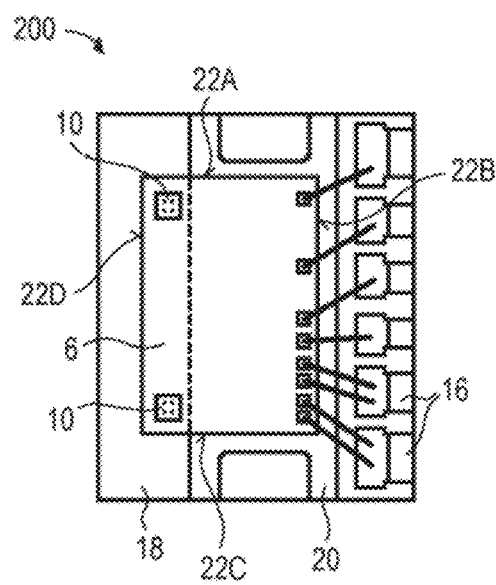

FIG. 2 contains FIGS. 2A and 2B and shows one example of a sensor package 200 in accordance with the disclosure. FIG. 2A shows a cross-sectional side view of the sensor package 200. FIG. 2B shows a plan view of the sensor package 200. The sensor package 200 can be similar to the sensor package 100 from FIG. 1 and comprise identical components.

The metal carriers 2 of the sensor packages 100 and 200 have different shapes. It is evident from FIG. 2B that in an orthogonal projection of the sensor chip 6 onto the surface 4 of the metal carrier 2, exactly three edges 22A, 22C and 22D of the sensor chip 6 are free of overlap with the surface 4 of the metal carrier 2. In the orthogonal projection of the sensor chip 6 onto the surface 4 of the metal carrier 2, a strip-shaped partial surface of the sensor chip 6 is free of overlap with the surface 4 of the metal carrier 2. In the example in FIG. 2, the sensor elements 10 are arranged within the overlap-free strip and in the two overlap-free corners of the sensor chip 6.

Figure 3A:
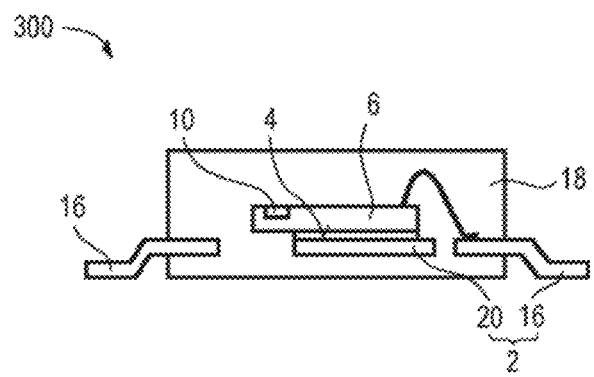
FIG. 3 contains FIGS. 3A and 3B, which schematically show a cross-sectional side view and a plan view of a sensor package 300 in accordance with the disclosure.
Figure 3B:
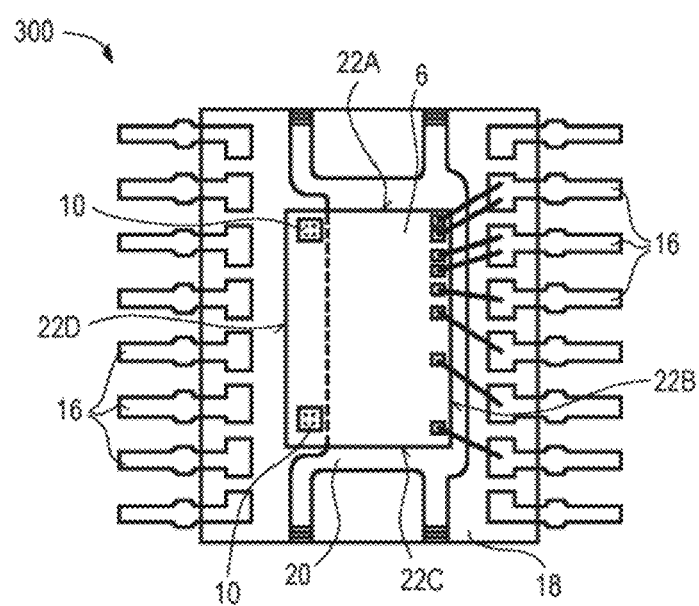

FIG. 3 contains FIGS. 3A and 3B and shows one example of a sensor package 300 in accordance with the disclosure. FIG. 3A shows a cross-sectional side view of the sensor package 300. FIG. 3B shows a plan view of the sensor package 300. The sensor package 300 can be similar to the sensor package 100 from FIG. 1 and comprise identical components.

The metal carriers 2 of the sensor packages 100 and 300 have different shapes. In the example in FIG. 3, the metal carrier comprises a die pad 20 and connection conductors 16 arranged around the die pad 20. It is evident from FIG. 3A that the connection conductors 16 projecting from the encapsulation material 18 are bent in a wing-shaped fashion. The sensor package 300 in FIG. 3 can be, in particular, a "gullwing" package. It is evident from FIG. 3B that in an orthogonal projection of the sensor chip 6 onto the surface 4 of the metal carrier 2, exactly three edges 22A, 22C and 22D of the sensor chip 6 are free of overlap with the surface 4 of the metal carrier 2. In the example in FIG. 3B, this can be achieved, inter alia, by means of a curved shape of the die pad 20. In the orthogonal projection of the sensor chip 6 onto the surface 4 of the metal carrier 2, a strip-shaped partial surface of the sensor chip 6 is free of overlap with the surface of the metal carrier 2. In the example in FIG. 3, the sensor elements 10 are arranged within the overlap-free strip and in the two overlap-free corners of the sensor chip 6.

Figure 4A:
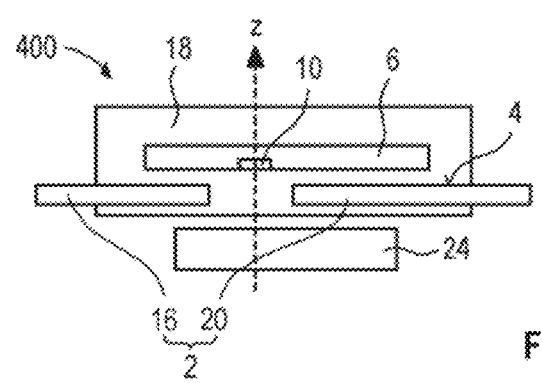
FIG. 4 contains FIGS. 4A and 4B, which schematically show a cross-sectional side view and a plan view of a sensor package 400 in accordance with the disclosure.
Figure 4B:
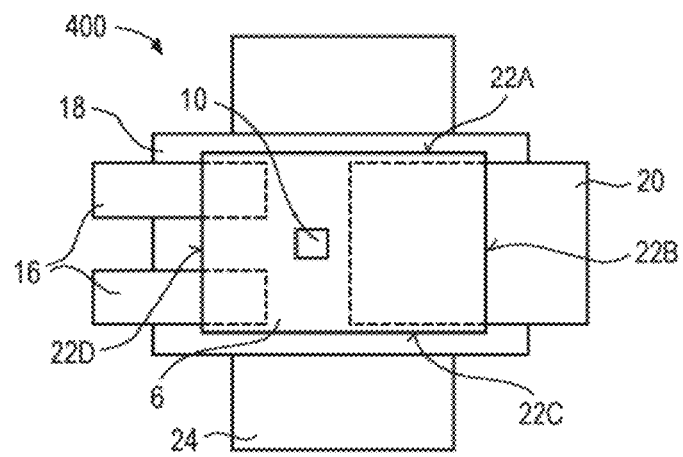

FIG. 4 contains FIGS. 4A and 4B and shows one example of a sensor package 400 in accordance with the disclosure. FIG. 4A shows a cross-sectional side view of the sensor package 400. FIG. 4B shows a plan view of the sensor package 400.

The sensor package 400 contains a metal carrier 2 comprising a die pad 20 and connection conductors 16. A sensor chip 6 having a sensor element 10 is arranged above a surface 4 of the metal carrier 2. In the example in FIG. 4, the sensor chip 6 comprises a single sensor element 10, which can face the metal carrier 2. In further examples, the sensor chip 6 can also comprise any other number of sensor elements 10, in particular two or three sensor elements. The sensor chip 6 can be secured on the metal carrier for example by way of a layer (not illustrated). The sensor package 400 can furthermore comprise an encapsulation material 18, which at least partly encapsulates the components of the sensor package 400.

The sensor package 400 can be arranged above a current conductor 24. In this case, the sensor element 10 can face the current conductor 24. The current conductor 24 can be for example a busbar or a current conductor (e.g. a copper layer) of a printed circuit board. The current conductor 24 is arranged outside the sensor package 400 and should therefore not be regarded as part of the sensor package 400. However, the sensor package 400 and the current conductor 24 can form a common device. In the example in FIG. 4, the metal carrier 2 is arranged between the current conductor 24 and the sensor chip 6. In this case, the surface 4 of the metal carrier 2 can be arranged substantially parallel to the current conductor 24. The sensor chip 6 is designed to detect a magnetic field induced by an electric current flowing through the current conductor 24. The electric current can generate eddy currents in the metal carrier.

It is evident from FIG. 4B that in an orthogonal projection of the sensor chip 6 onto the surface 4 of the metal carrier 2, all four edges 22A, 22B, 22C, 22D of the sensor chip 6 are free of overlap with the surface 4 of the metal carrier 2. In this case, the orthogonal projection extends along the z-axis shown in FIG. 4A. In the orthogonal projection of the sensor element 10 onto the surface 4 of the metal carrier 2, the sensor element 10 is free of overlap with the surface 4 of the metal carrier 2. The influence of eddy currents generated in the metal carrier 2 on the measurement results of the sensor chip 6 can be reduced as a result. In the orthogonal projection of the sensor chip 6 onto the surface 4 of the metal carrier 2, the sensor chip 6 at least partly overlaps the die pad 20 and the connection conductors 16.

Figure 5:
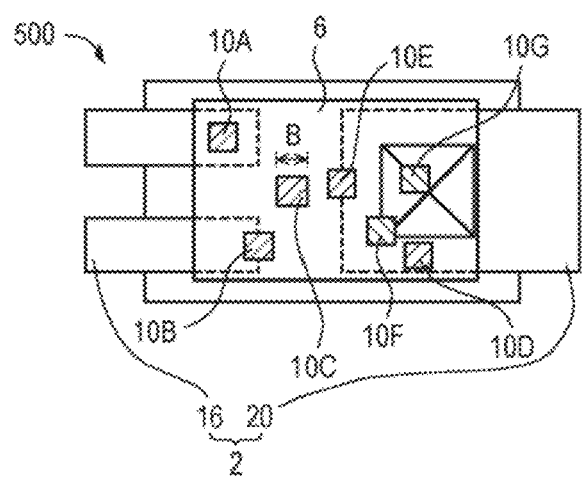
FIG. 5 shows a plan view of a sensor package 500 in accordance with the disclosure. Positions at which a sensor element can be arranged are illustrated in FIG. 5. Furthermore, positions at which a sensor element should not be arranged are illustrated.

FIG. 5 shows a plan view of a sensor package 500 in accordance with the disclosure. The sensor package 500 can in particular be similar to the sensor package 400 from FIG. 4 and comprise identical components. FIG. 5 illustrates positions at which a sensor element of the sensor chip 6 can be arranged, such that an influence of eddy currents on the measurement results of the sensor chip 6 can be reduced (cf. sensor elements 10A, 10B, 10C, 10D, 10E that are hatched at an angle (45°)). Furthermore, FIG. 5 illustrates positions at which a sensor element of the sensor chip 6 should not be arranged, since eddy currents may otherwise have an influence on the measurement results of the sensor chip 6 (cf. sensor elements 10F, 10G that are hatched at an angle (−45°)). The sensor elements or the positions thereof as illustrated in FIG. 5 are not necessarily actual components of the sensor package 500, but rather are shown merely for illustration purposes in FIG. 5.

The sensor element 10A of the sensor chip 6 can be arranged for example such that in an orthogonal projection of the sensor element 10A onto the surface 4 of the metal carrier 2, the sensor element 10A and the surface of a connection conductor 16 completely overlap. As explained in greater detail in association with FIG. 6, in this case the sensor element 10A must not be too far away from the edge of the connection conductor 16.

The sensor element 10B of the sensor chip 6 can be arranged for example such that in an orthogonal projection of the sensor element 10B onto the surface 4 of the metal carrier 2, the sensor element 10B and the surface of a connection conductor 16 partly overlap.

The sensor element 10C of the sensor chip 6 can be arranged for example such that in an orthogonal projection of the sensor element 10C onto the surface 4 of the metal carrier 2, the sensor element 10C and the surface 4 of the metal carrier 2 do not overlap. Such a sensor element has already been discussed in association with FIG. 4.

The sensor element 10D of the sensor chip 6 can be arranged for example such that in an orthogonal projection of the sensor element 10D onto the surface 4 of the metal carrier 2, the sensor element 10D and the surface of the die pad 20 completely overlap. As explained in greater detail in association with FIG. 6, in this case the sensor element 10D must not be too far away from the edge of the die pad 20.

The sensor element 10E of the sensor chip 6 can be arranged for example such that in an orthogonal projection of the sensor element 10E onto the surface 4 of the metal carrier 2, the sensor element 10E and the surface of the die pad 20 partly overlap.

Figure 6:
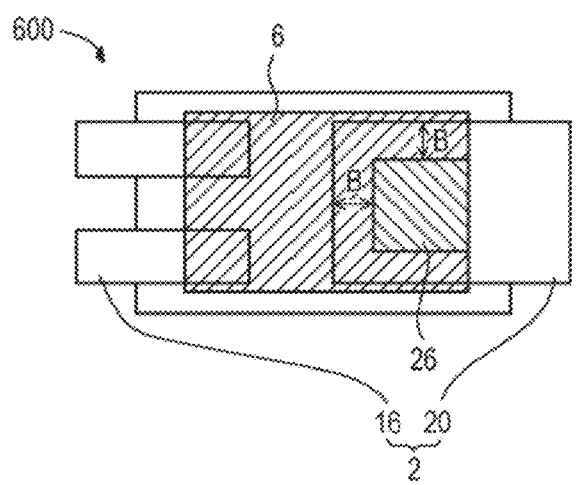
FIG. 6 shows a plan view of a sensor package 600 in accordance with the disclosure. Regions at which a sensor element can be arranged are illustrated in FIG. 6. Furthermore, regions at which a sensor element should not be arranged are illustrated.

The sensor elements 10F and 10G of the sensor chip 6 can be arranged for example such that in an orthogonal projection of the respective sensor element onto the surface 4 of the metal carrier 2, the respective sensor element and the surface of the die pad 20 completely overlap and the distance between the sensor element and the edge of the die pad 20 is too large, as explained in more specific detail in association with FIG. 6.

FIG. 6 shows a plan view of a sensor package 600 in accordance with the disclosure. The sensor package 600 can in particular be similar to the sensor package 400 from FIG. 4 and comprise identical components. FIG. 6 illustrates regions at which a sensor element of the sensor chip 6 can be arranged, such that an influence of eddy currents on the measurements results of the sensor chip 6 can be reduced (cf. area hatched at an angle (45°)). Furthermore, FIG. 6 illustrates regions at which a sensor element of the sensor chip 6 should not be arranged, since eddy currents may otherwise have an influence on the measurement results of the sensor chip 6 (cf. area hatched at an angle (−45°)).

The sensor element 10 of the sensor chip 6 can have an extent or width "B". In FIG. 5, the sensor element 10 is represented by a square having a side length "B". In further examples, the shape of the sensor element 10 can deviate from the illustration in FIG. 5. In this case, a width of the sensor element 10 can correspond to the dimension of the sensor element 10 in the direction of its maximum extent. The surface of the metal carrier 2 can have a partial surface 26 that is spaced apart from the entire edge of the surface of the metal carrier 2 by at least a width of the sensor element 10. In the example in FIG. 6 such a partial surface 26 is situated on the die pad 20. In order to reduce an influence of eddy currents on the measurement results of the sensor chip 6, a sensor element 10 of the sensor chip 6 should be arranged such that in an orthogonal projection of the sensor element 10 onto the partial surface 26, the sensor element 10 is free of overlap with the partial surface 26.

FIG. 7 contains FIGS. 7A to 7F, which schematically show plan views of sensor packages 700A to 700F in accordance with the disclosure. For the sake of simplicity, only the sensor chip 6 and the metal carrier 2 of the respective sensor package are illustrated in FIG. 7. However, the sensor packages in FIG. 7 can be similar to other sensor packages in accordance with the disclosure as described herein and can accordingly comprise further components.

Figure 7A:
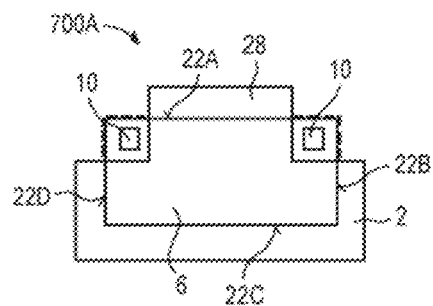
FIG. 7 contains FIGS. 7A to 7F, which schematically show plan views of sensor packages 700A to 700F in accordance with the disclosure.

FIG. 7A shows a sensor package 700A comprising a metal carrier 2 having the shape of a rectangle from which two corners have been removed. This results in a nose structure 28 of the metal carrier 2. In an orthogonal projection of the sensor chip 6 onto a surface of the metal carrier 2, exactly three edges 22A, 22B and 22D of the sensor chip 6 are free of overlap with the surface of the metal carrier 2. Two sensor elements 10 of the sensor chip 6 are arranged in the overlap-free corners.

Figure 7B:
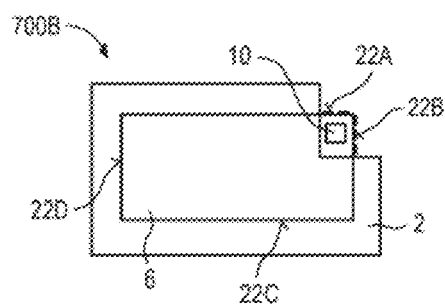

FIG. 7B shows a sensor package 700B comprising a metal carrier 2 having the shape of a rectangle from which one corner has been removed. In an orthogonal projection of the sensor chip 6 onto a surface of the metal carrier 2, exactly two edges 22A and 22B of the sensor chip 6 are free of overlap with the surface of the metal carrier 2. A sensor element 10 of the sensor chip is arranged in the overlap-free corner.

Figure 7C:
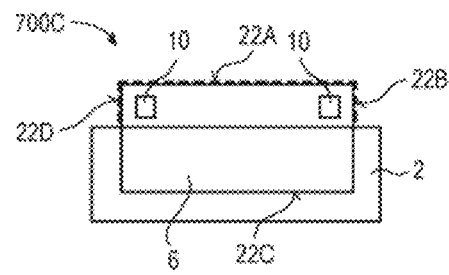

FIG. 7C shows a sensor package 700C comprising a metal carrier 2 having the shape of a rectangle. In an orthogonal projection of the sensor chip 6 onto a surface of the metal carrier 2, exactly three edges 22A, 22B and 22D of the sensor chip 6 are free of overlap with the surface of the metal carrier 2, such that an overlap-free strip is formed. The two sensor elements 10 of the sensor chip are arranged in the overlap-free corners of the strip.

Figure 7D:
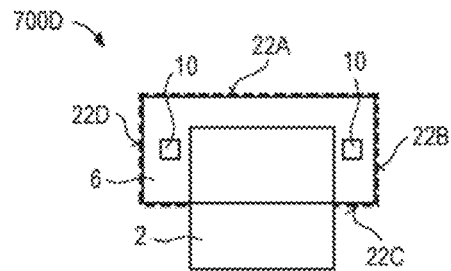

FIG. 7D shows a sensor package 700D comprising a metal carrier 2 having the shape of a rectangle. In an orthogonal projection of the sensor chip 6 onto a surface of the metal carrier 2, exactly four edges 22A, 22B, 22C, 22D of the sensor chip 6 are free of overlap with the surface of the metal carrier 2. The edge 22C is not completely free of overlap with the surface of the metal carrier 2. The two sensor elements 10 of the sensor chip 6 are arranged at the sides of the sensor chip 6 in the overlap-free region.

Figure 7E:
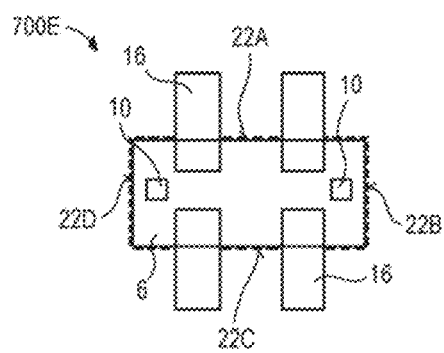

FIG. 7E shows a sensor package 700E comprising a metal carrier having four connection conductors 16. In an orthogonal projection of the sensor chip 6 onto a surface of the metal carrier, exactly four edges 22A, 22B, 22C, 22D of the sensor chip 6 are free of overlap with the surface of the metal carrier. The edges 22A and 22C are not completely free of overlap with the surface of the metal carrier 2. The two sensor elements 10 of the sensor chip 6 are arranged at the sides of the sensor chip 6 in the overlap-free region.

Figure 7F:
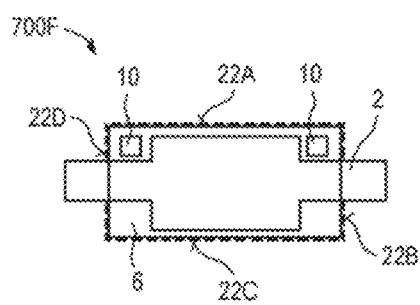

FIG. 7F shows a sensor package 700F comprising a metal carrier 2 having the shape of a rectangle from which four corners have been removed. In an orthogonal projection of the sensor chip 6 onto a surface of the metal carrier 2, exactly four edges 22A, 22B, 22C, 22D of the sensor chip 6 are free of overlap with the surface of the metal carrier 2. The edges 22B and 22D are not completely free of overlap with the surface of the metal carrier 2. Two sensor elements 10 of the sensor chip are arranged in the upper two overlap-free corners.

Figure 8:
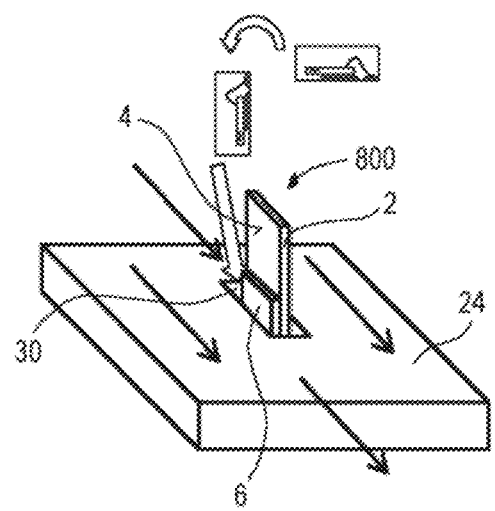
FIG. 8 shows a perspective view of a sensor package 800 in accordance with the disclosure, which sensor package is arranged in a current conductor.

FIG. 8 shows a perspective view of an arrangement comprising a sensor package 800 and a current conductor 24. The sensor package 800 can be similar to the sensor package 100 from FIG. 1, for example. The current conductor 24 can be a busbar having an opening 30. In the example in FIG. 8, the opening 30 can have the shape of a slot. The direction of an electric current flowing through the busbar 24 is indicated by arrows. The sensor package 800 can be arranged in the slot 30. In this case, the surface 4 of the metal carrier 2 can extend perpendicular to the busbar 24. In FIG. 8, the sensor package 800 is illustrated without encapsulation material for the sake of simplicity.

As a result of an arrangement of the sensor package 800 in the opening 30 of the busbar 24 and on account of the shape of the busbar 24, it is possible to generate magnetic fields suitable for a measurement by the sensor package 800. The extent of the slot 30 should be minimized in order to have only a small influence on the ohmic resistance of the busbar 24. Accordingly, the extent of the sensor package 800 should likewise be minimized. "Leadless" packages offer a way of satisfying this requirement.

Figure 9:
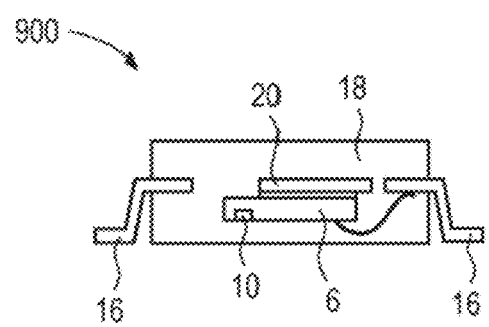
FIG. 9 schematically shows a cross-sectional side view of a sensor package 900 in accordance with the disclosure.

FIG. 9 schematically shows a cross-sectional side view of a sensor package 900 in accordance with the disclosure. The sensor package 900 can be similar to the sensor package 300 from FIG. 3. In contrast to FIG. 3, in FIG. 9, the connection conductors projecting from the encapsulation material 18 are bent in an opposite direction.

Figure 10:
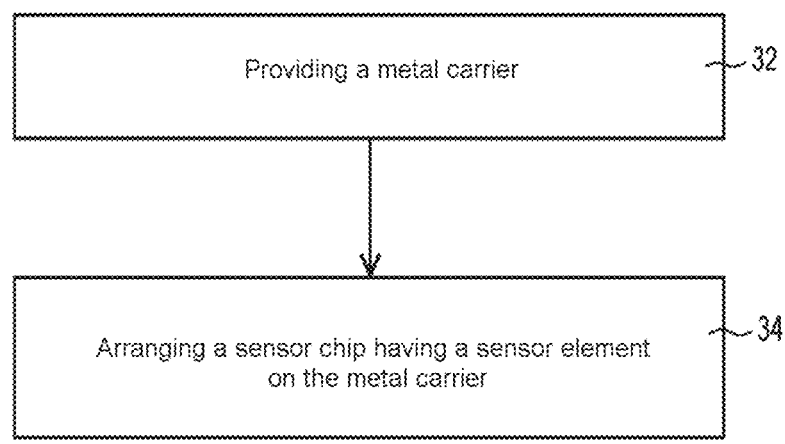
FIG. 10 shows a flow diagram of a method for producing a sensor package in accordance with the disclosure.

FIG. 10 shows a flow diagram of a method for producing a sensor package in accordance with the disclosure. At 32, a metal carrier is provided. At 34, a sensor chip having a sensor element is arranged on the metal carrier, wherein in an orthogonal projection of the sensor chip onto a surface of the metal carrier, at least two edges of the sensor chip are free of overlap with the surface of the metal carrier. The sensor chip is designed to detect a magnetic field induced by an electric current flowing through a current conductor.

EXAMPLES

Sensor packages and methods for producing sensor packages are explained in greater detail below on the basis of examples.

Example 1 is a sensor package, comprising: a metal carrier; and a sensor chip arranged on the metal carrier and having a first sensor element, wherein in an orthogonal projection of the sensor chip onto a surface of the metal carrier, at least two edge sections of the sensor chip are free of overlap with the surface of the metal carrier, wherein the sensor chip is designed to detect a magnetic field induced by an electric current flowing through a current conductor.

Example 2 is a sensor package according to example 1, wherein in an orthogonal projection of the first sensor element onto the surface of the metal carrier, the first sensor element is free of overlap with the surface of the metal carrier.

Example 3 is a sensor package according to example 1 or 2, wherein in the orthogonal projection of the sensor chip onto the surface of the metal carrier, exactly two edge sections of the sensor chip are free of overlap with the surface of the metal carrier, wherein the two edge sections adjoin one another and form an overlap-free corner of the sensor chip.

Example 4 is a sensor package according to example 3, wherein the first sensor element is arranged in the overlap-free corner of the sensor chip, wherein in an orthogonal projection of the first sensor element onto the surface of the metal carrier, the first sensor element is free of overlap with the surface of the metal carrier.

Example 5 is a sensor package according to example 1 or 2, wherein in the orthogonal projection of the sensor chip onto the surface of the metal carrier, exactly three edge sections of the sensor chip are free of overlap with the surface of the metal carrier, wherein respectively two of the three edge sections adjoin one another and form a first overlap-free corner and a second overlap-free corner of the sensor chip.

Example 6 is a sensor package according to example 5, wherein the sensor chip comprises a second sensor element, wherein the first sensor element is arranged in the first corner of the sensor chip, wherein in an orthogonal projection of the first sensor element onto the surface of the metal carrier, the first sensor element is free of overlap with the surface of the metal carrier, wherein the second sensor element is arranged in the second corner of the sensor chip, wherein in the orthogonal projection of the second sensor element onto the surface of the metal carrier, the second sensor element is free of overlap with the surface of the metal carrier.

Example 7 is a sensor package according to example 1 or 2, wherein in the orthogonal projection of the sensor chip onto the surface of the metal carrier, four or more edge sections of the sensor chip are free of overlap with the surface of the metal carrier.

Example 8 is a sensor package according to example 1, wherein in an orthogonal projection of the first sensor element onto the surface of the metal carrier, the first sensor element and the surface of the metal carrier at least partly overlap.

Example 9 is a sensor package according to any of the preceding examples, wherein the surface of the metal carrier comprises a partial surface that is spaced apart from the entire edge of the surface by at least a width of the sensor element, wherein in an orthogonal projection of the first sensor element onto the partial surface, the first sensor element is free of overlap with the partial surface.

Example 10 is a sensor package according to any of the preceding examples, wherein the sensor chip is a differential sensor chip.

Example 11 is a sensor package according to any of the preceding examples, wherein the current conductor is arranged outside the sensor package.

Example 12 is a sensor package according to any of the preceding examples, wherein the current conductor has an opening and the sensor package is arranged at least partly in the opening.

Example 13 is a sensor package according to example 12, wherein the surface of the metal carrier is arranged substantially perpendicular to the current conductor.

Example 14 is a sensor package according to any of the preceding examples, wherein the metal carrier is arranged between the current conductor and the sensor chip.

Example 15 is a sensor package according to any of the preceding examples, wherein the sensor package is coreless.

Example 16 is a method for producing a sensor package, wherein the method comprises: providing a metal carrier; and arranging a sensor chip having a sensor element on the metal carrier, wherein in an orthogonal projection of the sensor chip onto a surface of the metal carrier, at least two edge sections of the sensor chip are free of overlap with the surface of the metal carrier.

Example 17 is a method according to example 16, wherein arranging the sensor chip is carried out such that in an orthogonal projection of the sensor element onto the surface of the metal carrier, the sensor element is free of overlap with the surface of the metal carrier.

Although specific embodiments have been illustrated and described herein, it is obvious to the person of average skill in the art that a multiplicity of alternative and/or equivalent implementations can replace the specific embodiments shown and described, without departing from the scope of the present disclosure. This application is intended to cover all adaptations or variations of the specific embodiments discussed herein. Therefore, the intention is for this disclosure to be restricted only by the claims and the equivalents thereof.

The invention claimed is:

1. A sensor package, comprising:
   a metal carrier; and
   a sensor chip arranged on the metal carrier and having a first sensor element, the sensor chip being configured to detect a magnetic field induced by an electric current flowing through a current conductor,
   wherein in an orthogonal projection of the sensor chip onto a surface of the metal carrier, at least two edge sections of the sensor chip are free of overlap with a surface of the metal carrier, and
   wherein the electric current flowing through the current conductor to induce the magnetic field to be detected does not flow through the metal carrier.

2. The sensor package of claim 1, wherein the sensor chip is a differential sensor chip.

3. The sensor package as claimed in claim 1, wherein in an orthogonal projection of the first sensor element onto the surface of the metal carrier, the first sensor element is free of overlap with the surface of the metal carrier.

4. The sensor package as claimed in claim 1, wherein in the orthogonal projection of the sensor chip onto the surface of the metal carrier, two edge sections of the sensor chip are free of overlap with the surface of the metal carrier, and
   wherein the two edge sections adjoin one another and form an overlap-free corner of the sensor chip.

5. The sensor package as claimed in claim 4, wherein the first sensor element is arranged in the overlap-free corner of the sensor chip, and in an orthogonal projection of the first sensor element onto the surface of the metal carrier, the first sensor element is free of overlap with the surface of the metal carrier.

6. The sensor package as claimed in claim 1, wherein in the orthogonal projection of the sensor chip onto the surface of the metal carrier, three edge sections of the sensor chip are free of overlap with the surface of the metal carrier,
   wherein a first set of two of the three edge sections adjoin one another and form a first overlap-free corner of the sensor chip, and
   wherein a second set of two of the three edge sections adjoin one another to form a second overlap-free corner of the sensor chip.

7. The sensor package as claimed in claim 6,
   wherein the first sensor element is arranged in a first corner of the sensor chip, and in an orthogonal projection of the first sensor element onto the surface of the metal carrier, the first sensor element is free of overlap with the surface of the metal carrier, and
   wherein the sensor chip comprises a second sensor element arranged in a second corner of the sensor chip, and in an orthogonal projection of the second sensor element onto the surface of the metal carrier, the second sensor element is free of overlap with the surface of the metal carrier.

8. The sensor package as claimed in claim 1, wherein in an orthogonal projection of the sensor chip onto the surface of the metal carrier, four or more edge sections of the sensor chip are free of overlap with the surface of the metal carrier.

9. The sensor package as claimed in claim 1, wherein in an orthogonal projection of the first sensor element onto the surface of the metal carrier, the first sensor element and the surface of the metal carrier at least partly overlap.

10. The sensor package as claimed in claim 1, wherein the surface of the metal carrier comprises a partial surface that is spaced apart from an entire edge of the surface of the metal carrier by at least a width of the first sensor element, and in an orthogonal projection of the first sensor element onto the partial surface, the first sensor element is free of overlap with the partial surface.

11. The sensor package as claimed in claim 1, wherein the current conductor is arranged outside the sensor package.

12. The sensor package as claimed in claim 1, wherein the current conductor has an opening and the sensor package is arranged at least partly in the opening.

13. The sensor package as claimed in claim 12, wherein the surface of the metal carrier is arranged substantially perpendicular to the current conductor.

14. The sensor package as claimed in claim 1, wherein the metal carrier is arranged between the current conductor and the sensor chip.

15. The sensor package as claimed in claim 1, wherein the sensor package is coreless.

16. The sensor package of claim 1, wherein:
the first sensor element is from among a plurality of sensor elements,
the sensor chip only includes the plurality of sensor elements, and
in an orthogonal projection of each one of the plurality of sensor elements onto the surface of the metal carrier, each one of the plurality of sensor elements is (i) free of overlap with the surface of the metal carrier, and (ii) disposed on a different corner of the sensor chip.

17. The sensor package of claim 1, wherein in an orthogonal projection of the sensor chip onto the metal carrier, the sensor chip only includes regions that are free of overlap with the surface of the metal carrier having edge sections of at least two different edges of the sensor chip.

18. A method for producing a sensor package, wherein the method comprises:
providing a metal carrier; and
arranging a sensor chip having a sensor element on the metal carrier, the sensor chip being configured to detect a magnetic field induced by an electric current flowing through a current conductor,
wherein, in an orthogonal projection of the sensor chip onto a surface of the metal carrier, at least two edge sections of the sensor chip are free of overlap with the surface of the metal carrier, and
wherein the act of providing the metal carrier comprises providing the metal carrier such that the electric current flowing through the current conductor to induce the magnetic field to be detected does not flow through the metal carrier.

19. The method of claim 18, further comprising:
arranging the current conductor outside the sensor package, the current conductor having an opening; and
arranging the sensor package at least partly in the opening.

20. The method as claimed in claim 18, wherein the act of arranging the sensor chip is carried out such that, in an orthogonal projection of the sensor element onto the surface of the metal carrier, the sensor element is free of overlap with the surface of the metal carrier.

* * * * *